United States Patent
Yugou et al.

(10) Patent No.: US 9,945,886 B2
(45) Date of Patent: Apr. 17, 2018

(54) ELECTRICAL CURRENT DETECTION DEVICE EQUIPPED WITH SHUNT RESISTOR, AND POWER SUPPLY DEVICE

(71) Applicant: SANYO Electric Co., Ltd., Osaka (JP)

(72) Inventors: Masaki Yugou, Hyogo (JP); Kimihiko Furukawa, Hyogo (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 0 days.

(21) Appl. No.: 15/315,721

(22) PCT Filed: Jul. 3, 2015

(86) PCT No.: PCT/JP2015/003361
§ 371 (c)(1),
(2) Date: Dec. 1, 2016

(87) PCT Pub. No.: WO2016/047010
PCT Pub. Date: Mar. 31, 2016

(65) Prior Publication Data
US 2017/0089955 A1 Mar. 30, 2017

(30) Foreign Application Priority Data
Sep. 25, 2014 (JP) .................... 2014-195435

(51) Int. Cl.
*G01N 27/416* (2006.01)
*G01N 27/27* (2006.01)
(Continued)

(52) U.S. Cl.
CPC .......... *G01R 15/146* (2013.01); *B60L 3/0046* (2013.01); *G01R 19/10* (2013.01); *G01R 31/02* (2013.01); *G01R 31/3658* (2013.01)

(58) Field of Classification Search
CPC .................................................. G01R 31/3658
(Continued)

(56) References Cited

U.S. PATENT DOCUMENTS

| | | | |
|---|---|---|---|
| 7,875,928 B2 * | 1/2011 | Wachter | H01L 23/49562 257/341 |
| 8,907,676 B2 * | 12/2014 | Coenen | G01R 31/026 320/116 |
| 9,472,942 B2 * | 10/2016 | Hotta | H02M 7/537 |

FOREIGN PATENT DOCUMENTS

JP 2009-204531 9/2009

OTHER PUBLICATIONS

International Search Report of PCT application No. PCT/JP2015/003361 dated Sep. 8, 2015.

* cited by examiner

*Primary Examiner* — Reena Aurora
(74) *Attorney, Agent, or Firm* — Wenderoth, Lind & Ponack, L.L.P.

(57) ABSTRACT

An electrical current detection device is provided with a shunt resistor that includes a first conducting part, a second conducting part, a center conducting part disposed between the first conducting part and the second conducting part, a first resistor disposed between the first conducting part and the center conducting part, and a second resistor disposed between the second conducting part and the center conducting part, the second resistor having a greater resistance value than the first resistor. The electrical current detection device is further provided with: a signal output unit; an estimation unit that estimates a first estimated current value from the first detection signal, and estimates a second estimated current value from the second detection signal; and an determination unit that compares the first estimated current (Continued)

value and the second estimated current value, and determines the abnormality of the shunt resistor.

12 Claims, 5 Drawing Sheets

(51) Int. Cl.
  *G01R 15/14* (2006.01)
  *G01R 31/36* (2006.01)
  *G01R 31/02* (2006.01)
  *G01R 19/10* (2006.01)
  *B60L 3/00* (2006.01)
(58) Field of Classification Search
  USPC .......................................................... 324/434
  See application file for complete search history.

ELECTRICAL CURRENT DETECTION DEVICE EQUIPPED WITH SHUNT RESISTOR, AND POWER SUPPLY DEVICE

CROSS-REFERENCE TO RELATED APPLICATIONS

This application is a U.S. national stage application of the PCT International Application No. PCT/JP2015/003361 filed on Jul. 3, 2015, which claims the benefit of foreign priority of Japanese patent application No. 2014-195435 filed on Sep. 25, 2014, the contents all of which are incorporated herein by reference.

TECHNICAL FIELD

The present invention relates to an electrical current detection device which is capable to detect a failure detection of a shunt resistor, and a power supply device.

BACKGROUND ART

An electrical current detection device for measuring a current is configured by a sensor element such as a shunt resistor, a Hall element, and an electrical current detection device for estimating a current value from a detection signal of the sensor element. Concretely, the Hall element outputs the voltage as a detection signal corresponding the current, and then the current can be estimated from the detected voltage. Especially, in a case of using the shunt resistor, there is a feature that the electrical current detection device can be configured by comparatively simple circuits.

Also, a power supply device equipped with an assembled battery configured by a plurality of battery cells, has a state monitoring unit for monitoring states of the battery cells in order to avoid abnormal states of over-charge or over-discharge in the battery cells. The state monitoring unit includes a voltage detection circuit for detecting a voltage in each of the battery cells, a current detection circuit for detecting a charge-discharge current of the assembled battery, and a temperature detection circuit for detecting an ambient temperature (environmental temperature), a temperature of the assembled battery, or the like. In the same as the above-mentioned electrical current detection device, the current detection circuit estimates a charge-discharge current of the assembled battery, by using the detection signal from a sensor element for detecting the charge-discharge current of the assembled battery. Since this type of the power supply device monitors states of the battery cells based on the detection data including the current, it is not preferable that the power supply device is used, for example, in a condition where the current cannot be detected.

To resolve such a problem, as the configuration which effectively prevents a breakdown of the electrical current detection device, a power supply device equipped with a plurality of sensor elements for detecting a current through the same current passage, is proposed (Patent Literature 1). Concretely, the power supply device of Patent Literature 1 has a shunt resistor including two resistor elements, and two detection signals are outputted corresponding to a current flowing through the shunt resistor, and then the current flowing the shunt resistor is estimated based on one of the two detection signals. In this configuration, as long as either or both of the two detection signals are detected, as the current can be estimated, the breakdown of the power supply can be suppressed. Additionally, in the power supply device of Patent Literature 1, as the shunt resistor structure is the integral structure of the two resistors, the structure of the sensor element is simplified.

CITATION LIST

Patent Literature

Patent Literature 1: Japanese Laid-Open Patent Publication No. 2009-204531.

In the power supply device of Patent Literature 1, as mentioned above, by having the shunt resister which outputs the two detection signals corresponding to the same current, the structure of the sensor element is simplified. In this structure, as the shunt current structure is the integral structure of the two resistors, the two resistors are disposed under the same environment. The inventors of the present invention finds that abnormality in the two resistors of the shunt resistor structure may be caused by a common cause, when the actual usage of the power supply device of Patent Literature 1 is considered. For example, when corrosion of a metal constituting the shunt resistor structure occurs in a high-temperature and high-humidity environment, a surface of the shunt resistor structure is totally corroded. When the corrosion occurs, substantial resistance values of the two resistors change, and both of the two outputs of the shunt resistor structure become abnormal.

The present disclosure is developed for solving such a problem. Its purpose provides a technology that can detect abnormality of detection signals caused by a common cause in a shunt resistor outputting a plurality of detection signals.

To resolve the above problem, an electrical current detection device of one aspect of the present invention, comprises a shunt resistor for detecting a current, including a first conducting part, a second conducting part, a center conducting part disposed between the first conducting part and the second conducting part, a first resistor disposed between the first conducting part and the center conducting part, and a second resistor disposed between the second conducting part and the center conducting part and having a greater resistance value than the first resistor. The electrical current detection device further comprises: a signal output unit that obtains a first detection signal on the basis of the potential of the first conducting part and the center conducting part, and obtains a second detection signal on the basis of the potential of the second conducting part and the center conducting part; an estimation unit that estimates a first estimated current value from the first detection signal, and estimates a second estimated current value from the second detection signal; and an determination unit that compares the first estimated current value and the second estimated current value, and determines the abnormality of the shunt resistor.

A power supply device in one aspect of the present invention comprises an assembled battery including a plurality of battery cells; a state monitoring unit that monitors states of the plurality of the battery cells; and a shunt resistor connected to the assembled battery in series. The state monitoring unit includes a voltage detection unit that detects voltages of the plurality of the battery cells, and a current estimation unit that estimates a charge-discharge current of the assembled battery through the shunt resistor. The shunt resistor for detecting a current includes a first conducting part, a second conducting part, a center conducting part disposed between the first conducting part and the second conducting part, a first resistor disposed between the first conducting part and the center conducting part, and a second resistor disposed between the second conducting part and the center conducting part and having a greater resistance value than the first resistor. The current estimation unit includes: a signal output unit that obtains a first detection signal on the basis of the potential of the first conducting part and the center conducting part, and obtains a second detection signal on the basis of the potential of the second conducting part and the center conducting part; an estimation unit that estimates a first estimated current value from the first detection signal, and estimates a second estimated current value from the second detection signal; and an determination unit that compares the first estimated current value and the second estimated current value, and determines the abnormality of the shunt resistor. The state monitoring unit outputs a signal informing of an abnormality when the abnormality of the shunt resistor is determined.

A electrical current detection device or a power supply device of a certain embodiment of the present invention, when failure or breakdown caused by the common cause occurs, increases or decreases of resistance values caused by the common cause occurs. As the resistance values of two resistors in a shunt resistor are different, increases or decreases of resistance values caused by the common cause, causes different influences to estimated current values estimated by the two resistors. Accordingly, the estimated current values are estimated from the two resistors of which the resistance value are different, and by comparing the two estimated current values, abnormality of detection signals caused by the common cause, can be detected.

DESCRIPTION OF EMBODIMENTS

Figure 1:
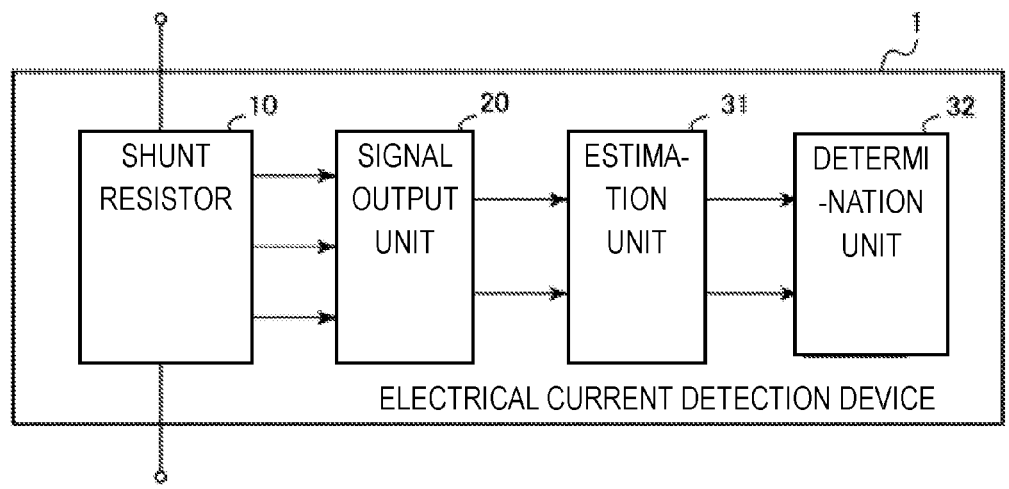
FIG. 1 is a block diagram of an electrical current detection device of a first embodiment of the present invention.

The overview of one embodiment of the present invention will be described based on FIG. 1. FIG. 1 is a schematic block diagram showing the overview of electrical current detection device 1 of a first embodiment of the present invention. Electrical current detection device 1 includes: shunt resistor 10 which has a plurality of current flow terminals and a plurality of detection terminals; signal output unit 20 which obtains electrical potentials from the plurality of detection terminals of shunt resistor 10 and outputs a plurality of detection signals; and estimation unit 31 which estimates a plurality of estimated current values of the current flowing between the current flow terminals based on the plurality of the detection signals outputted from signal output unit 20. Also, electrical current detection device 1 includes determination unit 32 which compares the plurality of the estimated current values estimated by estimation unit 31 and determines an abnormality of shunt resistor 10.

Figure 2:
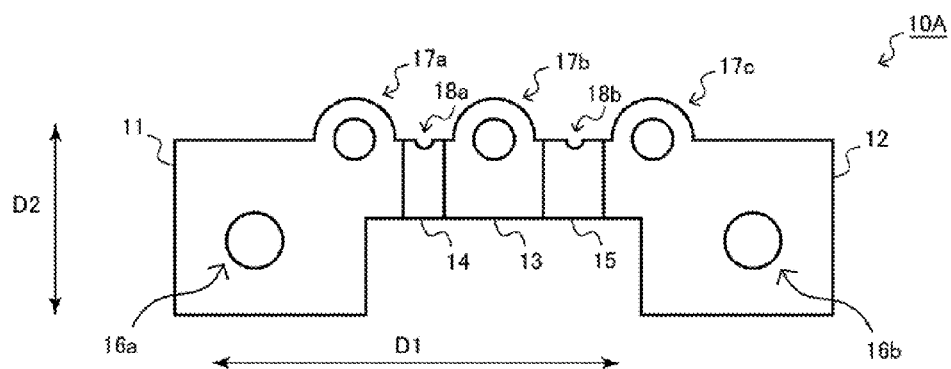
FIG. 2 is a plan view as viewed from the top showing a concrete example of a shunt resistor in the embodiment of the present invention.

FIG. 2 shows a structure of shunt resistor 10A as one concrete example to realize shunt resistor 10. Shunt resistor 10A is configured by a plurality of conducting parts and a plurality of resistors, and is formed in a flat board shape extending in one direction. Hereinafter, within a plane where shunt resistor 10A extends, first direction D1 is defined as a longitudinal direction of shunt resistor 10A, and second direction D2 is defined as a short direction of shunt resistor 10A.

As shown in FIG. 2, concretely, shunt resistor 10A has first conducting part 11 and second conducting part 12 located at both ends of shunt resistor 10A in first direction D1. Also, shunt resistor 10A has center conducting part 13 located between first conducting part 11 and second conducting part 12. It is preferable that first conducting part 11, second conducting part 12, and center conducting part 13 are made of conductive material such as copper.

First resistor 14 is disposed between first conducting part 11 and center conducting part 13, and then first conducting part 11 and center conducting part 13 are connected through first resistor 14. Second resistor 15 is disposed between second conducting part 12 and center conducting part 13, and then second conducting part 12 and center conducting part 13 are connected through second resistor 15. First resistor 14 and second resistor 15 are made of conductive material such as, for example, an alloy of Manganin essentially comprising copper and manganese. It is preferable that in such conductive material, the change of resistance value by temperature is small and the thermo-electromotive force to copper is small.

Also, second resistor 15 has a greater resistance value than the first resistor 14. For example, when first resistor 14 and second resistor 15 are made of the same material, the resistance value can be increased by making a sectional area small to current flowing through shunt resistor 10A, and the resistance value can be also increased by making a size in the current flowing direction long. In shunt resistor 10A shown in FIG. 2, by making sizes in first direction D1 of first resistor 14 and second resistor 15 different, the resistance value of second resistor 15 is bigger than the resistance value of first resistor 14. Here, first resistor 14 and second resistor 15 respectively have cutouts 18a, 18b in order to adjust the resistance value of the resistor in the manufacturing process.

In first conducting part 11 and second conducting part 12, a plurality of through-holes are provided so as to form the current flow terminals and the detection terminals. Concretely, first conducting part 11 includes first current flow terminal part 16a for providing the current flow terminal, and first detection terminal part 17a for providing the detection terminal. Second conducting part 12 includes second current flow terminal part 16b for providing the current flow terminal, and second detection terminal part 17b for providing the detection terminal. Center conducting part 13 includes third detection terminal part 17c for providing the detection terminal, and then one through-hole is provided to form the detection terminal. First detection terminal part 17a, second detection terminal part 17b, and third detection terminal part 17c are connected to above-mentioned signal output unit 20. By this configuration, signal output unit 20 can obtain potentials of first conducting part 11, second conducting part 12, and center conducting part 13 through each of the detection terminals.

As mentioned above, the resistors of shunt resistor 10 have the cutouts to adjust the resistance values of the resistors. Shunt resistor 10 has screws which are inserted into the through-holes formed at the current flow terminal parts or detection terminal parts, and wirings connected to signal output unit 20 are electrically connected to shunt resistor 10A through fixing by the screws. Additionally, shunt resistor 10A is fixed to a case member where shunt resistor 10A is disposed, by the screws which are screwed into the through-holes. Thus, when vibration is applied to shunt resistor 10, the stresses may be concentrated on cutout 18a, 18b of first resistor 14, second resistor 15.

Figure 3:
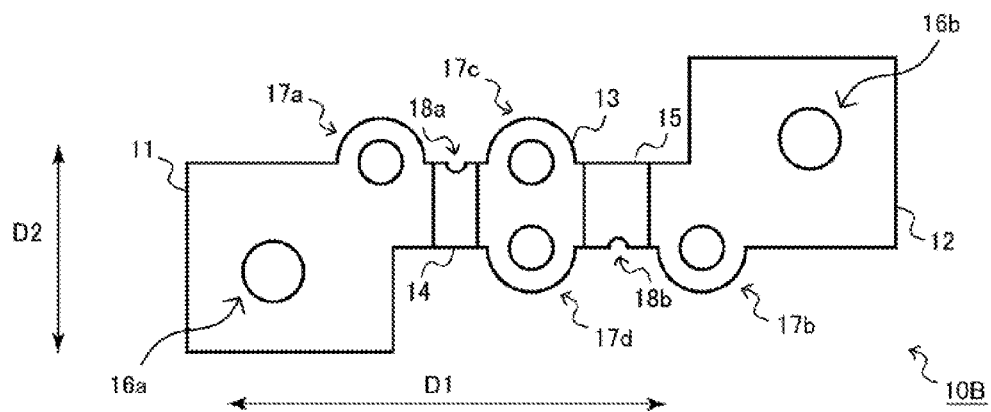
FIG. 3 is a plan view as viewed from the top showing another concrete example of the shunt resistor in the embodiment of the present invention.

FIG. 3 shows a structure of shunt resistor 10B as another concrete example to realize shunt resistor 10. According to the following configuration of shunt resistor 10B, a deformation of the shunt resistor caused by the above-mentioned stresses due to fixing the shunt resistor, can be suppressed. Here, in shunt resistor 10B, the same configurational elements as the configurational elements configuring above-mentioned shunt resistor 10A, are put with the same marks, and their explanations are omitted.

As shown in FIG. 3, first detection terminal part 17a and second detection terminal part 17b are respectively located at both ends of shunt resistor 10B in second direction D2. Further, center conducting part 13 of shunt resistor 10B includes fourth detection terminal part 17d in addition to third detection terminal part 17c. Third detection terminal part 17c is disposed at first detection terminal part 17a side in second direction D2. Fourth detection terminal part 17d is disposed at second detection terminal part 17b side in second direction D2. Signal output unit 20 obtains the first detection signal through first detection terminal part 17a and third detection terminal part 17c, and the second detection signal through second detection terminal part 17b and fourth detection terminal part 17d.

According to the above-mentioned configuration, the plurality of the detection terminal parts are comparatively evenly disposed in shunt resistor 10B. As mentioned above, the detection terminal parts also have a function as fixing parts which fix the shunt resistor, and as the detection terminal parts are evenly disposed, the concentration of the stresses can be suppressed. Additionally, as two current detection passes for obtaining the potential of center conducting part 13 are secured, even though disconnection or the like happens, either of the first detection signal and the second detection signal can be obtained.

As mentioned above, according to the configuration of shunt resistor 10A, through the third detection terminal part, both of the first detection signal and the second detection signal can be obtained. Then, by the communization of parts (components), the number of parts (components) can be decreased. On the other hand, according to the configuration of shunt resistor 10B, as the concentration of the stresses which occur in the vicinity of the detection terminal part can be suppressed, the failure of the shunt resistor due to the stress can be prevented. It is preferable that the above-mentioned shunt resistor 10A or the shunt resistor 10B is selected corresponding to the purpose.

Figure 5:
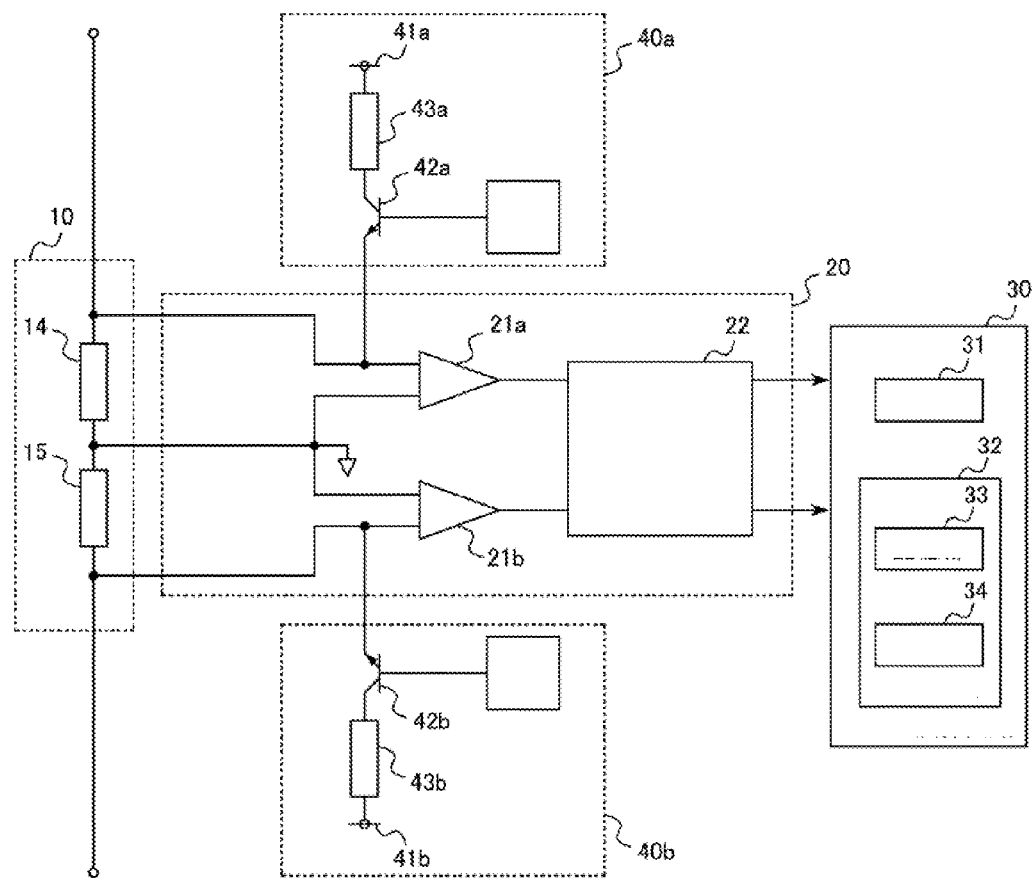
FIG. 5 is a circuit diagram of the electrical current detection device of the first embodiment of the present invention.

FIG. 5 illustrates a circuit configuration of electrical current detection device 1. As shown in FIG. 5, signal output unit 20 is configured by a plurality of differential amplifiers to which the detection signal of shunt resistor 10 is inputted, and A/D converter 22 which converts the output signals of the plurality of differential amplifiers to the digital signals. Signal output unit 20 shown in FIG. 5 has, as the plurality of the differential amplifier, first differential amplifier 21a to which the potentials of first detection terminal part 17a and second detection terminal part 17b are inputted, and second differential amplifier 21b to which the potentials of second detection terminal part 17b and third detection terminal part 17c are inputted. First differential amplifier 21a outputs the first detection signal corresponding to both-end voltage of first resistor 14 from the inputted signal, and then this first detection signal is inputted to A/D converter 22. Second differential amplifier 21b outputs the second detection signal corresponding to both-end voltage of second resistor 15 from the inputted signal, and then this second detection signal is inputted to A/D converter 22. A/D converter 22 converts the inputted analog signal to the digital signal, and then the digital signal is inputted to calculation circuit 30 which includes above-mentioned determination unit 32 or estimation unit 31. Calculation circuit 30 is configured so as to estimate the estimated current value of current flowing between the current flow terminals of shunt resistor 10, or so as to determine the abnormality of shunt resistor 10.

Here, first differential amplifier 21a and second differential amplifier 21b have the same amplification factor. Further, signal output unit 20 may have a level shift circuit which shifts the output range of the detection signal outputted by first differential amplifier 21a or second differential amplifier 21b.

According to the above-mentioned configuration, signal output unit 20 obtains the first detection signal corresponding to the both-end voltage of first resistor 14, and the second detection signal corresponding to the both-end voltage of second resistor 15, and then outputs the first detection signal and the second detection signal to estimation unit 31. Estimation unit 31 included in calculation circuit 30, can estimate a plurality of estimated current values of current flowing through shunt resistor 10, based on the first detection signal and the second detection signal outputted by signal output unit 20. Concretely, estimation unit 31 estimates a first estimated current value based on the first detection signal, and a second estimated current value based on the second detection signal.

Generally, in A/D converter, the voltage range capable of being inputted is predetermined, and then the analog signal within the voltage range capable of being inputted is converted to the digital data. A resolution of the A/D converter is decided by circuit components used therein. For example, in a case of using the A/D converter of 12 bits, the maximum resolution is $1/4096$, and then about 0.0244% of the voltage value corresponding to the voltage range capable of being inputted, is the identifiable minimum voltage change.

In the current detection device, in a case of using the A/D converter, the shunt resistor outputs the detection signal corresponding to the flowing current, and the detection signal is amplified by the differential amplifier, and then the detection signal is inputted to the A/D converter. Therefore, the magnitude of the detection signal inputted to the A/D converter, is decided by a magnitude of a current flowing through the shunt resister, a resistance value of the shunt resistor, and a amplification factor of the differential amplifier. Accordingly, when the differential amplifiers have the same amplification factor, as the resistance value of the shunt resistor is bigger, the identifiable minimum voltage change becomes small. On contrast, the detectable current range is restricted by the voltage range capable of being inputted to the A/D converter. Namely, when the resistance value of the shunt resistor is small, the accuracy of the estimated current value is decreased, but the detectable current range can be increased.

As mentioned above, current detection device 1 is configured by the shunt resistor having the two resistors, and the resistance value of first resistor 14 is smaller than the resistance value of second resistor 15. First differential amplifier 21a and second differential amplifier 21b have the same amplification factor. Therefore, when the first detection signal and the second detection signal outputted for the same current are compared, the second detection signal outputted based on the both-end voltage of second resistor 15 is higher. Accordingly, the first estimated current value based on the first detection signal has the features of the wide detectable current range, compared with the second estimated current value, and the small identifiable current change. Namely, in this configuration of electrical current detection device 1, the second estimated current value is in the narrow detectable current range, but is the highly accurate estimated value.

Thus, in electrical current detection device 1, when both of the first detection signal and the second detection signal are inputted, estimation unit 31 outputs the second estimated current value based on the second detection signal. When only the first detection signal is inputted and the second detection signal is out of the inputable voltage range of the A/D converter, estimation unit 31 outputs the first estimated current value based on the first detection signal. By this configuration, electrical current detection device 1 can make the detection current range of the current detection device wide, and can improve the accuracy of the current detection.

Even when either of the first detection signal and the second detection signal is not inputted to estimation unit 31 due to disconnection or the like, electrical current detection device 1 can estimate the flowing current value flowing through shunt resistor 10 based on the inputted detection signal.

As current detection device 1 uses the shunt resistor of the integral structure of the two resistors, the two resistors are disposed under the same environment. In the electrical current detection device 1 of this configuration, abnormality in the two resistors of the shunt resistor may be caused by a common cause. Concretely, connecting failure of the detection terminal part of center conducting part 13, corrosion of the shunt resistor, or deformation of the shunt resistor due to the stress concentration, is thought as the common cause. When the abnormality occurs due to these common cause, the same change in the resistance values of first resistor 14 and second resistor 15 may happen. Concretely, the abnormality in which 0.05 mΩ is substantially increased in the resistance values of both of first resistor 14 and second resistor 15, may happen.

As mentioned above, in electrical current detection device 1, the resistance values of first resistor 14 and second resistor 15 are different, and then the detectable current ranges of the first estimated current value estimated from first resistor 14 and the second estimated current value estimated from second resistor 15, are different. In a case where the resistance values of first resistor 14 and second resistor 15 are different, even though the substantially same resistance value change in each of the resistors occurs, the change amounts of the estimated current values influenced by the same resistance value change can cause a difference.

For example, in a case where the resistance value of the first resistor is 0.15 mΩ, and the resistance value of the second resistor is 0.25 mΩ, in the normal state, when 40 A of the current flows through the shunt resistor, the both-end voltage of the first resistor 14 is 6 mV, and the both-end voltage of the second resistor 15 is 10 mV. Estimation unit 31 estimates the first estimated current value as 40 A from the both-end voltage 6 mV of the first resistor, based on the first detection signal, through the A/D convertor, or the like.

The second estimated current is estimated as 40 A from the both-end voltage 10 mV of the second resistor, based on the second detection signal. Here, it is assumed that the resistance value increase of 0.05 mΩ occurs in each of the resistors due to the common cause, when 40 A of the current flows through the shunt resistor, the both-end voltage of the first resistor 14 is 8 mV, and the both-end voltage of the second resistor 15 is 12 mV. As estimation unit 31 cannot recognize the resistance value increase of 0.05 mΩ caused due to the common cause as the abnormality, estimation unit 31 estimates the current values in the same way as the normal state. Concretely, the first estimated current is estimated as about 53.3 A based on the first detection signal, and the second estimated current is estimated as 48 A based on the second detection signal. Namely, when the resistance value abnormality in both of first resistor 14 and second resistor 15 occurs due to the common cause, the values of the first estimated current value and the second estimated current value become different.

Since current detection device 1 includes shunt resistor 10A of which the resistance values of first resistor 14 and second resistor 15 are different, and determination unit 32 which compares the first estimated current value and the second estimated current value estimated from each of the resistors, current detection device 1 can detect the failure or breakdown of shunt resistor 10A through determination unit 32. Concretely, determination unit 32 includes storage unit 33 storing a predetermined threshold, and comparison unit 34 calculating difference $\Delta I$ between the first estimated current value and the second estimated current value, and comparison unit 34 comparing difference $\Delta I$ and threshold α. When difference $\Delta I$ between the first estimated current value and the second estimated current value is smaller than threshold α as the calculation result of comparison unit 34, determination unit 32 determines the normality of the shunt resistor. While, when difference $\Delta I$ is bigger than threshold α, determination unit 32 determines the abnormality.

Especially, when corrosion of a metal constituting the shunt resistor structure occurs in a high-temperature and high-humidity environment, a surface of the shunt resistor structure is totally corroded. Namely, when the corrosion occurs, resistance values of first resistor 14 and second resistor 15 change, and both of the two outputs of the shunt resistor become abnormal. When the surface of the shunt resistor is corroded, a high-resistance layer is formed at the surface of the shunt resistor. As the first resistor and the second resistor are disposed under the same environment, it is thought that they are fundamentally corroded in the same way, and the same resistance value change occurs.

As mentioned above, in the embodiment of the present invention, since current detection device 1 includes shunt resistor 10A of which the resistance values of first resistor 14 and second resistor 15 are different, and determination unit 32 which compares the first estimated current value and the second estimated current value estimated from each of the resistors, current detection device 1 can detect the failure or breakdown of shunt resistor 10A through determination unit 32, even when the abnormality of shunt resistor 10A due to the common cause occurs.

In addition, a corrosionproof processing may be applied to either of the first resistor and the second resistor in current detection device 1. By applying the corrosionproof processing to only one of the first resistor and the second resistor, when the abnormality due to the corrosion occurs, the difference between the first estimated current value and the second estimated current value becomes big. Here, in the errors of the estimated current values to the resistance value changes, the error of the first estimated current value estimated from first resistor 14 is larger than the error of the second estimated current value. Therefore, it is preferable that the corrosionproof processing is applied to a surface of second resistor 15. In this configuration, the abnormality of the shunt resistor can be detected early, compared with a configuration without a corrosionproof processing. Then, among the failures or breakdowns of the shunt resistor due to the common causes, this configuration can improve the accuracy of the detection to the abnormality of the shunt resistor, especially due to the corrosion.

In the above-mentioned embodiment, cutout 18a, 18b are formed respectively at first resistor 14, second resistor 15. Instead, the cutout may be provided in one of first resistor 14 and second resistor 15. As mentioned above, in a case of forming the cutout, when outer force is applied to shunt resistor 10, the stress is concentrated in the vicinity of the cutout. In a case where the cutout is provided in one of first resistor 14 and second resistor 15, since the stress is concentrated on the resistor having the cutout, deformation of the resistor having no cutout can be suppressed.

Figure 4:
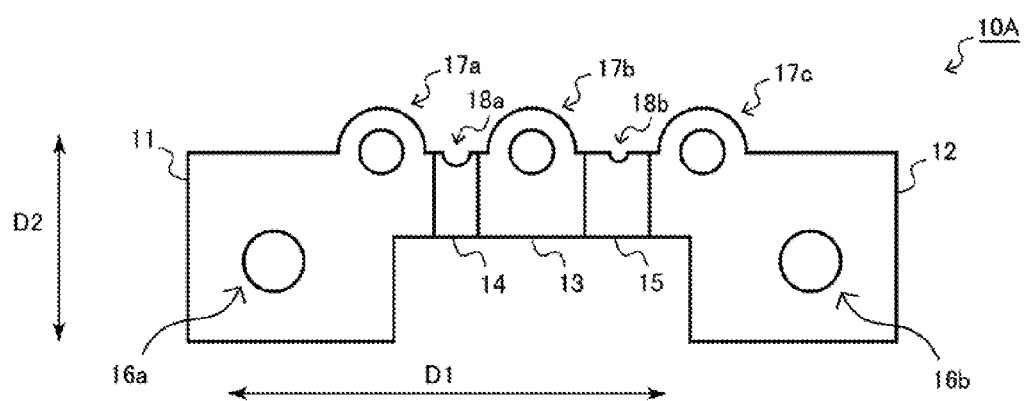
FIG. 4 is a plan view as viewed from the top showing a further other concrete example of the shunt resistor in the embodiment of the present invention.

Instead, as shown in FIG. 4, first resistor 14 has a first cutout, and second resistor 15 has a second cutout, and sizes of the first cutout of first resistor 14 and the second cutout of second resistor 15 may be different. In this configuration, as the stress is concentrated on the resistor having the big cutout, deformation of the resistor having the small cutout can be suppressed. Additionally, as the cutout can be formed in each of first resistor 14 and second resistor 15, adjusting the resistance values in the manufacturing process is easily carried out, and then the accuracy of the resistance values of first resistor 14 and second resistor 15 can be improved.

According to the above-mentioned configuration, the stress can be concentrated on one of first resistor 14 and second resistor 15, and this configuration can make the resistance value changes due to the deformations of first resistor 14 and second resistor 15 different. Namely, in this configuration, in a case where the deformation of shunt resistor 10 by the outer force occurs, the difference of the first estimated current value and the second estimated current value can be made big. Here, in the errors of the estimated current values to the resistance value changes, the error of the first estimated current value estimated from first resistor 14 is larger than the error of the second estimated current value. Therefore, it is preferable that the stress is concentrated on first resistor 14.

In the above-mentioned configuration of the current detection device, the flowing current can be estimated based on two of the detection signals obtained by using the shunt resistor of the integral structure of the two resistors. In addition, in a case where the abnormality caused due to the common cause occurs in the two resistors disposed under the same environment and the failure or breakdown of the shunt resistor happens, the failure or breakdown of the shunt resistor can be detected by the determination of determination unit 32. Especially, while decreasing the number of parts by using the shunt resistor of the integral structure of the two resistors, the abnormality caused by the common cause due to the integral structure can be detected, and then the device can be prevented from being used in a state of the in-range failures.

Electrical current detection device 1 may include first voltage supply circuit 40a and second voltage supply circuit 40b in order to detect disconnection of wiring. As shown in FIG. 5, first voltage supply circuit 40a is configured of first power supply line 41a, first voltage dividing resistor 43a which is connected to first power supply line 41a and is pulled up to the voltage of first power supply line 41a, and first switch 42a which connects to first voltage dividing resistor 43a and one input terminal of first differential amplifier 21a. The other input terminal of first differential amplifier 21a is connected to the ground potential. As the node is provided on a current path connecting first differential amplifier 21a and first conducting part 11 of shunt resistor 10, by controlling first switch 42a in the ON state, first switch 42a applies the voltage of first power supply line 41a to first voltage dividing resistor 43a and first resistor 14.

Also, second voltage supply circuit 40b is configured of second power supply line 41b, second voltage dividing resistor 43b which is connected to second power supply line 41b and is pulled up to the voltage of second power supply line 41b, and second switch 42b which connects to second voltage dividing resistor 43b and one input terminal of second differential amplifier 21b. The other input terminal of second differential amplifier 21b is connected to the ground potential. As the node is provided on a current path connecting second differential amplifier 21b and second conducting part 12 of shunt resistor 10, by controlling second switch 42b in the ON state, second switch 42b applies the voltage of second power supply line 41b to second voltage dividing resistor 43b and second resistor 15. Since the difference between first voltage supply circuit 40a and second voltage supply circuit 40b is only the current path for detecting disconnection, as one example, the first voltage supply circuit will be explained in the following.

In a case where first voltage supply circuit 40a controls first switch 42a in the ON state, the voltage of power supply line 41a, for example, 5V voltage is applied to first voltage dividing resistor 43a and first resistor 14. Here, disconnection detection is carried out in a no load state where power is not supplied except first voltage supply circuit 40a. For example, in a case where power source device 1 is provided so as to monitor charge-discharge current of a power supply device installed on a vehicle, the disconnection detection is carried out at a timing when the vehicle stops.

In a normal state where disconnection does not occur in the current path through which first voltage supply circuit 40a supplies the voltage, the voltages are generated corresponding to the resistance values of first voltage dividing resistor 43a and first resistor 14 respectively. Namely, the voltage 5V is divided by the resistance value of first resistor 14 and the resistance value of first voltage dividing resistor 43a. Since the resistance value of first resistor 14 is so small as to be ignorable as compared with the resistance value of first voltage dividing resistor 43a, the ground potential is inputted into first differential amplifier 43a, and then the first detection signal is substantially 0 V.

On contrast, in a state where disconnection occurs in the current path through which first voltage supply circuit 40a supplies the voltage, in the two input terminals of first differential amplifier 21a, 5 V of the voltage in power supply line 41a is inputted to the input terminal connected to first voltage supply circuit 40a, and the ground potential is inputted to the other input terminal. Therefore, first differential amplifier 21a outputs the detection signal of overshoot voltage.

Further, in a case where wiring is not perfect disconnection, but is a state of connecting in high resistance value, the detection signal of the potential corresponding to the increased resistance value, is outputted. In the embodiment of the present invention, it is preferable that first resistor 14 is the resistor having 0.1 to 0.5 m$\Omega$ inclusive, first voltage dividing resistor 43a is the resistor having 1 to 10 K$\Omega$ inclusive. For example, it is thought that the resistance value of first resistor 14 is 0.15 mΩ, and the resistance value of first voltage dividing resistor 43a is 10 KΩ. When 100 mΩ is increased in the resistance value of the current path where first voltage supply circuit 40a supply the voltage due to the occurrence of contact failure or the like, the voltage inputted to first differential amplifier 21a is the value that 5 V is divided by 100.15 mΩ and 10 KΩ. The detection signal outputted from first differential amplifier 21a, is inputted to calculation circuit 30 through A/D converter 22.

From the above-mentioned configuration, in electrical current detection device 1, by determining a operating state of first switch 42a through calculation circuit 30 to which output of first differential amplifier 21 is inputted, and the first estimated current estimated by estimation unit 30, disconnection of the corresponding current path can be detected. Additionally, second voltage supply circuit 40b is also in the same way. Concretely, when disconnection or contact failure occurs in the current path through which the voltage supply circuit supply the voltage, the voltage value equal to or more than a predetermined voltage value is detected, at a time of carrying out the inspection of the above-mentioned abnormality determination. In the embodiment of the present invention, disconnection or contact failure in each of the current paths can be detected, by calculating through using the estimated current value estimated based on the detection signal inputted from first differential amplifier 21a or second differential amplifier 21b.

The above-mentioned contact failure of the measurement line does not directly influence the resistance value of the resistor in the shunt resistor. However due to heat generation at the portion of the contact failure, measured value of the current detection device is influenced, and then in-range failure may occur. Especially, overheat as the common cause due to the contact failure at the detection terminal part of center conducting part 13, influences both of the first detection signal and the second detection signal. In the electrical current detection device of the present invention, by conducting the inspection of the above-mentioned disconnection detection, the abnormality of the current detection device due to the contact failure at the connecting part of the measurement lines, can be detected.

As mentioned above, in shunt resistor 10, first conducting part 11, second conducting part 12, and center conducting part 13 can be made of copper. First resistor 14 and second resistor 15 can be made of manganin. According to this configuration, temperature dependency of first resistor 14 and second resistor of which accuracy of the resistance values is required, can be made small. Then the accuracy of the current detection can be improved. Namely, in order to configure the current detection device having a high accuracy, a special alloy as a resistor of manganin or the like having a low temperature dependency is used.

However, in a case where the metal constituting the conducting part and the metal constituting the resistor are different, the thermal electromotive force due to heat generation of shunt resistor 10 may happen. Concretely, in the metal member where different kinds of metals are connected, when a temperature difference occurs, the voltage between the metals generates (the Seebeck effect). The thermal electromotive force coefficient of manganin to copper is 2 μV/K, and it is comparatively small. However, the generated temperature difference may influence the current detection. Especially, when the overheat at the detection terminal part of the center conducting part occur, the Seebeck effect happens between the first resistor and the center conducting part, or between the second resistor and the center conducting part. Namely, overheat of the detection terminal part of center conducting part 13, is caused by the common cause, and then the overheat influences both of the first detection signal and the second detection signal as the abnormality.

In the above-mentioned configuration, for example, when the temperature difference of 100° C. (373.15K) occurs, the electromotive voltage of about 0.75 mV is generated by the Seebeck effect. When it is thought that the detecting current is 100 A, the resistance value of the first resistor is 0.15 mΩ, and the resistance value of the second resistor is 0.25 mΩ, this is the error of about 5%, about 3%. As the manufacturing error of the shunt resistor is at most about 3%, the influence by the thermal electromotive voltage cannot be ignored.

In the above-mentioned configuration, by making the resistance values of the first resistor and the second resistor different, the influences by the common cause can be made different. In the above-mentioned thought, the estimated current based on the first detection signal is 105 A, the estimated current based on the second detection signal is 103 A, and this difference is apparently more than the error by the resolution of the A/D converter. Therefore, by comparing the first estimated current value estimated from the first detection signal and the first estimated current value estimated from the first detection signal, the failure of the current detection device can be detected in a case where the in-range failure by the common cause occurs. Namely, by the above-mentioned determination unit 32, the failure of the shunt resister by the abnormality due to the overheat of the detection terminal part of the center conducting part can be detected.

Figure 6:
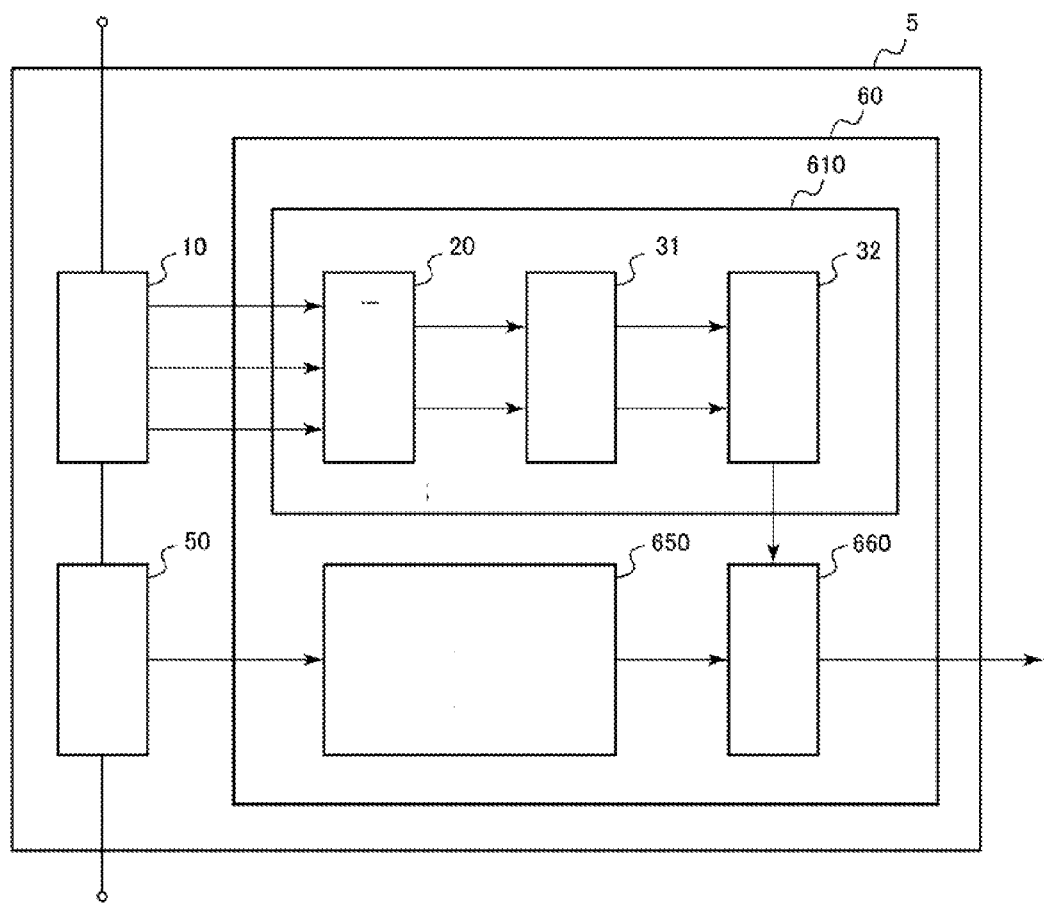
FIG. 6 is a block diagram of an electrical current detection device of a second embodiment of the present invention.

The overview of another embodiment of the present invention will be described based on FIG. 6. FIG. 6 is a schematic block diagram showing the overview of electrical current detection device 5 of a second embodiment of the present invention. Here, the same configurational elements as the configurational elements explained in the above-mentioned current detection device of the first embodiment, are put with the same marks, and their explanations are omitted. Power supply device 5 includes assembled battery 50 configured of a plurality of battery cells, shunt resistor 10 connected in series to assembled battery 50, and state monitoring unit 60 monitoring states of assembled battery 50. State monitoring unit 60 includes a current estimation unit 610 that estimates a charge-discharge current of assembled battery 50 through shunt resistor 10, voltage detection unit 650 that detects voltages of the battery cells from the potentials between the terminals of the plurality of the battery cells constituting assembled battery 50, and controlling unit 660 to which detection results of current estimation unit 610 and voltage detection unit 650 are inputted. Current estimation unit 610 includes signal output unit 20, estimation unit 31, and determination unit 32 in the first embodiment. In the second embodiment, determination unit 32 compares the estimated current value based on the first detection signal and the estimated current value based on the second detection signal, and outputs the signals corresponding to the determination results to controlling unit 660.

Figure 7:
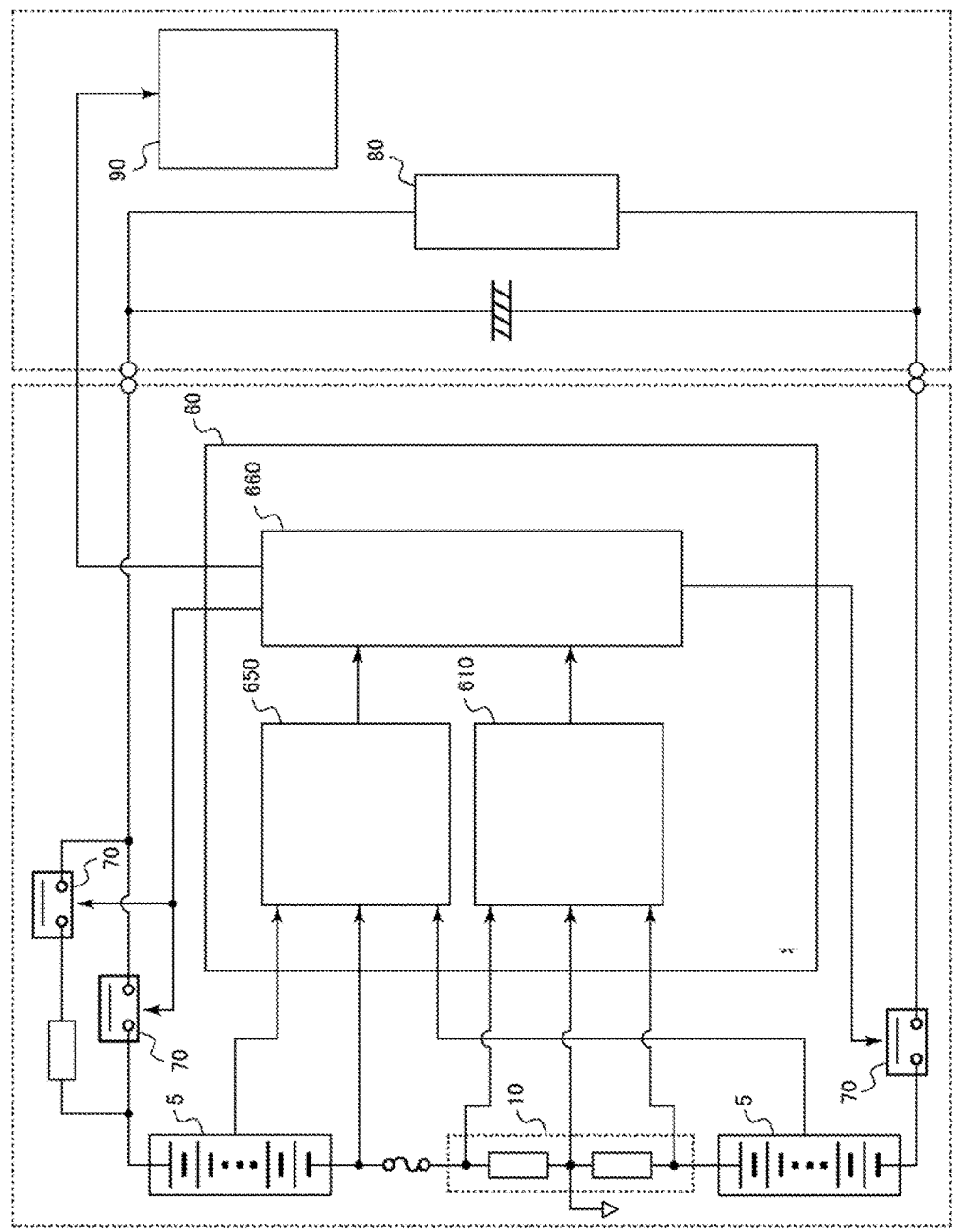
FIG. 7 is a circuit diagram of the electrical current detection device of the second embodiment of the present invention.

FIG. 7 is a circuit diagram in a case where power supply device 5 of FIG. 6 is installed on the vehicle. The output of assembled battery 50 is supplied to inverter 80 of the vehicle through relays 70. Vehicle ECU 90 is installed on the vehicle, and carries out the control of the vehicle or the control of inverter 80. When determination unit 32 detects the abnormality of the shunt resistor, controlling unit 660 prohibits the ON operation of relay 70, and informs vehicle ECU 90 of the abnormality of the shunt resistor. When the abnormal signal is received from controlling unit 660, vehicle ECU 90 may light a warning lamp of the display of the vehicle. According to this configuration, usage of power supply device 5 with the current detection device in the abnormal state can be prevented.

The embodiments of the present invention are explained above. The above explanation is made based on the embodiments of the present invention. The person of the ordinary skill in the art can understand that these embodiments are illustrated, and these combined constitution elements and these combined processes can be modified, and such modified examples are covered by the scope of the present invention.

The invention claimed is:

1. An electrical current detection device, comprising:
a shunt resistor for detecting a current, including a first conducting part, a second conducting part, a center conducting part disposed between the first conducting part and the second conducting part, a first resistor disposed between the first conducting part and the center conducting part, and a second resistor disposed between the second conducting part and the center conducting part and having a greater resistance value than the first resistor;
a signal output unit that obtains a first detection signal on the basis of the potential of the first conducting part and the center conducting part, and obtains a second detection signal on the basis of the potential of the second conducting part and the center conducting part;
an estimation unit that estimates a first estimated current value from the first detection signal, and estimates a second estimated current value from the second detection signal; and
a determination unit that compares the first estimated current value and the second estimated current value, and determines an abnormality of the shunt resistor.

2. The electrical current detection device according to claim 1,
wherein the determination unit includes a storage unit storing a predetermined threshold, and a comparison unit calculating a difference between the first estimated current value and the second estimated current value, and comparing the difference and the threshold,
the determination unit determines a normality of the shunt resistor when the threshold is smaller than the difference, and
the determination unit determines an abnormality of the shunt resistor when the threshold is bigger than the difference.

3. The electrical current detection device according to claim 1, further comprising: a first voltage dividing resistor connected to the first resistor;
a first voltage supply circuit applying a predetermined voltage to the first voltage dividing resistor and the first resistor;
a second voltage dividing resistor connected to the second resistor; and
a second voltage supply circuit applying a predetermined voltage to the second voltage dividing resistor and the second resistor,
wherein when the first voltage supply circuit or the second voltage supply circuit supplies the predetermined voltage, the determination unit compares the first estimated current value and the second estimated current value estimated by the estimation unit, and determines the abnormality of the shunt resistor.

4. The electrical current detection device according to claim 1,
wherein in the shunt resistor, the first conducting part, the second conducting part, and the center conducting part are made of a first metal, and the first resistor and the second resistor are made of a second metal different from the first metal.

5. The electrical current detection device according to claim 1,
wherein among the first resistor and the second resistor, a corrosionproof processing is applied to a surface of the second resistor.

6. The electrical current detection device according to claim 1,
wherein the first resistor has a first cutout, and the second resistor has a second cutout, and sizes of the first cutout of the first resistor and the second cutout of the second resistor are different.

7. The electrical current detection device according to claim 1,
wherein a cutout is provided in one of the first resistor and the second resistor.

8. The electrical current detection device according to claim 1,
wherein the shunt resistor has a flat board shape extending in one direction, and within a plane where the shunt resistor extends, a first direction is defined as a longitudinal direction of the shunt resistor, and a second direction is defined as a short direction of the shunt resistor,
the first conducting part includes a first current flow terminal part to which a terminal for a current flowing through the shunt resistor is connected, and a first detection terminal part to which the signal output unit is connected,
the second conducting part includes a second current flow terminal part to which a terminal for a current flowing through the shunt resistor is connected, and a second detection terminal part to which the signal output unit is connected,
the first conducting part and the second conducting part are respectively located at both ends of the shunt resistor in the first direction, and
the first detection terminal part and the second detection terminal part are respectively located at both ends of the shunt resistor in the second direction.

9. The electrical current detection device according to claim 8,
wherein the center conducting part includes a third detection terminal part and a fourth detection terminal part to which the signal output unit is connected, disposed at both ends of the center conducting part in the second direction,
the first detection terminal part and the third detection terminal part are located at one end part of the shunt resistor in the second direction, and the second detection terminal part and the fourth detection terminal part are located at the other end part of the shunt resistor in the second direction, and
the signal output unit obtains the first detection signal through the first detection terminal part and the third detection terminal part, and the second detection signal through the second detection terminal part and the fourth detection terminal part.

10. A power supply device comprising:

an assembled battery including a plurality of battery cells;

a state monitoring unit that monitors states of the plurality of the battery cells; and a shunt resistor connected to the assembled battery in series, wherein the state monitoring unit includes a voltage detection unit that detects voltages of the plurality of the battery cells, and a current estimation unit that estimates a charge-discharge current of the assembled battery through the shunt resistor, the shunt resistor for detecting a current includes a first conducting part, a second conducting part, a center conducting part disposed between the first conducting part and the second conducting part, a first resistor disposed between the first conducting part and the center conducting part, and a second resistor disposed between the second conducting part and the center conducting part and having a greater resistance value than the first resistor, wherein the current estimation unit includes:

a signal output unit that obtains a first detection signal on the basis of the potential of the first conducting part and the center conducting part, and obtains a second detection signal on the basis of the potential of the second conducting part and the center conducting part;

estimation unit that estimates a first estimated current value from the first detection signal, and estimates a second estimated current value from the second detection signal; and an determination unit that compares the first estimated current value and the second estimated current value, and determines an abnormality of the shunt resistor, and wherein the state monitoring unit outputs a signal informing of an abnormality when the abnormality of the shunt resistor is determined.

11. The power supply device according to claim 10, wherein the determination unit includes a storage unit storing a predetermined threshold, and a comparison unit calculating a difference between the first estimated current value and the second estimated current value, and comparing the difference and the threshold, the determination unit determines a normality of the shunt resistor when the threshold is smaller than the difference, and the determination unit determines an abnormality of the shunt resistor when the threshold is bigger than the difference.

12. The power supply device according to claim 10, wherein in the shunt resistor, the first conducting part, the second conducting part, and the center conducting part are made of a first metal, and the first resistor and the second resistor are made of a second metal different from the first metal.

* * * * *